(12) United States Patent
Generazio

(10) Patent No.: US 9,559,616 B2
(45) Date of Patent: Jan. 31, 2017

(54) QUASI-STATIC ELECTRIC FIELD GENERATOR

(71) Applicant: The United States of America as represented by the Administrator of the National Aeronautics and Space Administration, Washington, DC (US)

(72) Inventor: Edward R. Generazio, Yorktown, VA (US)

(73) Assignee: THE UNITED STATES OF AMERICA AS REPRESENTED BY THE ADMINISTRATOR OF THE NATIONAL AERONAUTICS AND SPACE ADMINISTRATION., Washington, DC (US)

( * ) Notice: Subject to any disclaimer, the term of this patent is extended or adjusted under 35 U.S.C. 154(b) by 835 days.

(21) Appl. No.: 13/800,379

(22) Filed: Mar. 13, 2013

(65) Prior Publication Data

US 2016/0049885 A1    Feb. 18, 2016

(51) Int. Cl.
*H02N 1/08* (2006.01)
*G01R 29/12* (2006.01)
(Continued)

(52) U.S. Cl.
CPC ............... *H02N 1/08* (2013.01); *G01R 29/12* (2013.01); *H02N 1/04* (2013.01); *G01V 1/201* (2013.01);
(Continued)

(58) Field of Classification Search
CPC ............ G01V 1/38; G01V 1/201; G01V 3/15; G01V 3/12; G01V 3/083
(Continued)

(56) References Cited

U.S. PATENT DOCUMENTS 2,820,947 A * 1/1958 Gunn ............... G01W 1/16
310/309
3,273,397 A * 9/1966 Forward ............. G01R 33/022
324/257

(Continued)

OTHER PUBLICATIONS

Jackson, J.D., "Classical Electrodynamics", 3rd Ed. John Wiley & Sons, Hoboken, New Jersey, p. 52, 1999.
(Continued)

*Primary Examiner* — Jermele M Hollington
*Assistant Examiner* — Christopher McAndrew
(74) *Attorney, Agent, or Firm* — Jennifer L. Riley; Robin W. Edwards

(57) ABSTRACT

A generator for producing an electric field for with an inspection technology system is provided. The generator provides the required variable magnitude quasi-static electric fields for the "illumination" of objects, areas and volumes to be inspected by the system, and produces human-safe electric fields that are only visible to the system. The generator includes a casing, a driven, non-conducting and triboelectrically neutral rotation shaft mounted therein, an ungrounded electrostatic dipole element which works in the quasi-static range, and a non-conducting support for mounting the dipole element to the shaft. The dipole element has a wireless motor system and a charging system which are wholly contained within the dipole element and the support that uses an electrostatic approach to charge the dipole element.

20 Claims, 8 Drawing Sheets

(51) Int. Cl.
*H02N 1/04* (2006.01)
*G01V 3/08* (2006.01)
*G01V 1/20* (2006.01)
*G01V 3/12* (2006.01)
*G01V 3/15* (2006.01)
*G01V 1/38* (2006.01)

(52) U.S. Cl.
CPC ............... *G01V 1/38* (2013.01); *G01V 3/083* (2013.01); *G01V 3/12* (2013.01); *G01V 3/15* (2013.01)

(58) Field of Classification Search
USPC .......................................................... 324/365
See application file for complete search history.

(56) References Cited

U.S. PATENT DOCUMENTS

| | | | | |
|---|---|---|---|---|
| 3,960,439 A * | 6/1976 | Becker | .................... | G02F 1/135 349/166 |
| 4,005,357 A * | 1/1977 | Parkinson | .............. | G01R 29/12 244/1 A |
| 4,197,737 A * | 4/1980 | Pittman | ................... | G01P 15/09 310/330 |
| 4,311,046 A * | 1/1982 | Pittman | ................... | G01P 15/09 73/178 R |
| 4,381,803 A * | 5/1983 | Weidmann | ......... | B65H 63/0321 139/370.2 |
| 5,164,673 A | 11/1992 | Rosener | | |
| 5,313,266 A * | 5/1994 | Keolian | ............ | G01D 5/35329 250/227.19 |
| 5,666,023 A * | 9/1997 | Pelletier | ............ | H01J 37/32192 204/298.38 |
| 5,986,456 A | 11/1999 | Yamashita | | |
| 6,146,813 A * | 11/2000 | Girard | ....................... | G11B 5/11 219/121.85 |
| 6,681,094 B2 * | 1/2004 | Horrall | .............. | G03G 15/0131 399/101 |
| 6,762,683 B1 * | 7/2004 | Giesler | ............ | G06K 19/07749 235/383 |
| 7,446,479 B2 * | 11/2008 | Chistyakov | ....... | H01J 37/32009 118/723 DC |
| 7,529,075 B1 * | 5/2009 | Hull | ................... | G01R 29/0821 361/233 |
| 2002/0100607 A1 * | 8/2002 | Girard | ....................... | G11B 5/11 174/250 |
| 2005/0200228 A1 * | 9/2005 | Ogi | ........................ | H01R 39/08 310/219 |
| 2006/0071669 A1 | 4/2006 | Funato et al. | | |
| 2006/0164094 A1 | 7/2006 | Golder et al. | | |
| 2007/0119701 A1 * | 5/2007 | Chistyakov | ............. | C23C 14/35 204/192.1 |
| 2008/0306359 A1 * | 12/2008 | Zdeblick | .............. | A61B 5/0028 600/302 |
| 2009/0284405 A1 | 11/2009 | Salmon et al. | | |
| 2009/0295644 A1 | 12/2009 | Curran et al. | | |
| 2012/0068269 A1 * | 3/2012 | Lin | ....................... | H01L 27/115 257/368 |
| 2012/0199755 A1 | 8/2012 | Generazio | | |

OTHER PUBLICATIONS

Halliday, David and Resnick, Robert, "Fundamentals of Physics", John Wiley & Sons, Inc., New York, London, Sydney, Toronto, p. 468, 1970.
Horowitz Paul and Hill, Winfield "The Art of Electronics", 2nd Ed., Cambrdge University Press, pp. 113-173, 1989.

* cited by examiner

QUASI-STATIC ELECTRIC FIELD GENERATOR

STATEMENT REGARDING FEDERALLY SPONSORED RESEARCH AND DEVELOPMENT

This invention was made by an employee of the United States Government and may be manufactured and used by or for the Government of the United States of America for governmental purposes without the payment of any royalties or therefore.

FIELD OF THE INVENTION

The present invention relates to an electric field generator used in electric field measurement. The generator is used with the electric field quantitative measurement system disclosed in U.S. patent application Ser. No. 13/020,025, published as US Patent Application Number 2012-0199755 A1.

BACKGROUND OF THE INVENTION

Article and personnel inspection systems and methods range from labor-intensive and intrusive manual searches to mechanized systems that use non-intrusive x-ray or electromagnetic wave imaging to expose concealed articles, damage, etc. For example, most weapons detections systems rely on the concealed weapons having x-ray absorption greater than the concealing articles or the concealed weapon and having electrical conductivity large enough to be detectable by radiated electromagnetic waves. Weapons such as ceramic knifes or plastic guns (with little or no metal content) or disassembled distributed weapons are undetectable by most non-intrusive inspection devices. These are low density systems that have been made from low density materials or made low density by distributing components through a larger volume.

In another example, the degraded electrical properties of insulation surrounding conduction wires is known to have caused fatal aircraft crashes. Most insulation integrity systems are not capable of non-intrusive quantitative detection and characterization of insulation degradation.

The co-pending United States Patent Application Number 2012-0199755 A1, the contents of which are incorporated by reference herein in its entirety, discloses an electric field quantitative measurement system which is based upon Electric Field Imaging (EFI) to overcome the disadvantages of the prior systems. An externally generated electric field is created to interrogate and inspect objects. A complication arises where large magnitude electric field strengths over large areas are needed to allow the electric field to remotely interact with and pass through the object of interest, and to do so without the electric field source being in physical contact with the object. Physical contact with the electric field source is prohibited, where electric field distortion, arcing and dangerously high current levels can occur if physical contact is made. During EFI inspections, uniform or controlled non-uniform interrogating electric fields are required to make quantitative assessments of the inspection results.

One key feature of EFI is that components that are sensitive to electric fields all have leakage currents that move electrical charges within the component to reduce the effect of the applied electric field. This is addressed in electrical systems by using dynamic fields that oscillate rapidly (described by Maxwell's equations) to counter the effects of intrinsic component current leakage while generating oscillatory (over 10 KHz) electrical currents as used in radio wave frequency (RF) reception.

Previous generation of large magnitude electric fields are based on electronic circuitry voltage doubling-tripling, step-up transformers, or by electrostatic approaches. Voltage doubling-tripling and step-up transformers are often highly lethal systems that need to have extensive safety guards in place to prohibit tampering or access to lethal components. Electrostatic approaches, such as a Van de Graaff device, are often more safe to use due to the low currents (microamps) produced. These Van de Graaff systems are limited in applicability because of the special configurations used to produce large constant voltage potentials such as those required for linear particle accelerators. Typical electrostatic applications generate fixed large magnitude electric fields that terminate on electrically conducting surfaces that form charged particle focusing elements. These electrostatic approaches are physically fixed structures operating to generate fixed electrical potential levels and do not generate the quasi-static electric fields required for EFI.

A generator which is used with the electric field quantitative measurement system of United States Patent Application Number 2012-0199755 A1 is provided herein which provides improvements to existing structures and which overcomes the disadvantages presented by previous technologies. Other features and advantages will become apparent upon a reading of the attached specification, in combination with a study of the drawings.

SUMMARY OF THE INVENTION

A generator for producing an electric field for use with an inspection technology system is provided. The generator provides the required variable magnitude quasi-static electric fields for the "illumination" of objects, areas, and volumes to be inspected by the system, and produces human-safe electric fields that are only visible to the system. The generator includes a casing, a driven, non-conducting and triboelectrically neutral rotation shaft mounted therein, an ungrounded electrostatic dipole element which works in the quasi-static range, and a non-conducting support for mounting the dipole element to the shaft. The dipole element has a wireless motor system and a charging system which are wholly contained within the dipole element and the support that uses an electrostatic approach to charge the dipole element.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

Figure 1:
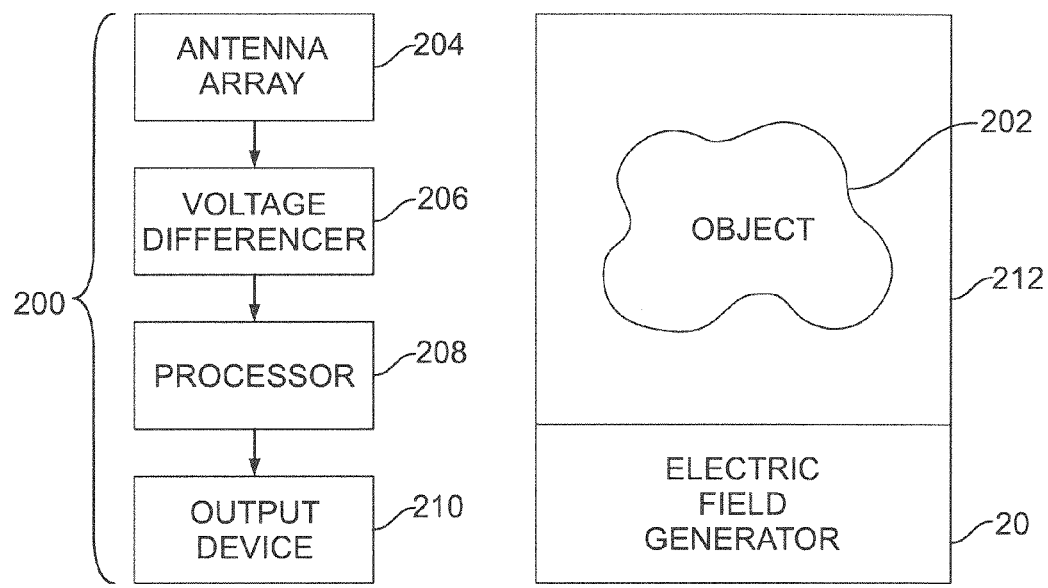
FIG. 1 is a schematic view of a system for making quantitative measurements of an electric field using a generator which incorporates the features of one embodiment.

DETAILED DESCRIPTION OF THE
ILLUSTRATED EMBODIMENT

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein. Therefore, unless otherwise noted, features disclosed herein may be combined together to form additional combinations that were not otherwise shown for purposes of brevity.

An electric field generator 20 is provided for electric field measurement. The electric field generator is used with the electric field quantitative measurement system 200 disclosed in United States Patent Application Number 2012-0199755 A1 which has been incorporated herein by reference in its entirety, for the construction of an Electric Field Imaging (EFI) inspection system for making quantitative measurements of an electric field. The quantitative measurements produced by system 200, when used with the generator 20, provide information about both the magnitude and direction of the electric field at a variety of locations therein. The generator 20 provides the required variable magnitude quasi-static electric fields for the "illumination" of objects, areas and volumes to be inspected by the system. The generator 20 produces human-safe electric fields that are only visible to the system 200.

The generator works 20 in the quasi-static range where the electric field is present for a sufficiently long enough time for the system 200 response to reach a steady state, but not long enough for intrinsic leakage or oscillating currents to dominate the measurement of the true magnitude of the static electric field. During EFI inspections, repeated generation of the static electric field is needed when using scanning configurations or for signal acquisition enhancements, such as signal averaging. Repeated generation of the static electric fields is to be at low enough frequencies such that the system 200 response is an accurate estimate of the true static electric field, and this is the definition of the quasi-static range used in the present invention.

The present generator 20, when combined with the system 200, provides a non-destructive EFI. The generator 20 provides spatially uniform, quasi-static, large magnitude electric fields that are human-safe (supporting only micro ampere currents) over large areas and volumes. The generator 20 produces high quasi-static positive and negative electric fields with human-safe currents over a large area and, with no power or control over electrically conductive paths. The electric fields from the generator 20 do not need to be terminated on specific conducting surfaces. The electric fields of the generator 20 interact freely with and pass through the object(s) 202 of interest.

The generator 20, along with its associated system 200, can be used in military and civilian applications. The generator 20 and system 200 quantifies the distortion of the applied electric field of the generator 20 to detect, locate and characterize personnel, baggage, wire insulation, hidden objects, subterranean variations, material properties, materials present (liquid, solid, insulating, semi-conducting, conducting, metallic, non-metallic, polymer, ceramic, composite, etc.), material variations, material damage, material age, material integrity, hidden structures, structural variations, etc. Inspection capabilities include inspection and characterization of liquid, solid, emulsion, foam, insulating, semi-conducting, conducting, metallic, non-metallic, polymer, ceramic, composite, etc., materials and complex structures and their substructures. Security detection can include detection of hidden solid metallic systems, such as metallic guns, and nonmetallic polymer and ceramic weapons and explosives. The generator 20 may be used for product quality control and intruder detection. The generator 20 can be made to be larger or smaller, the size being dependent upon the inspection and monitoring needs of the application. The generator 20 can be configured for large scale or small scale applications to include security applications (e.g., personnel inspection at airports), surveillance applications (e.g., geographic area drive or fly overs), and inspections (e.g., package and/or luggage inspections, wire condition inspections, etc.).

As described in United States Patent Application Number 2012-0199755 A1, the system 200, see FIG. 1, includes an array 204 of antennas, with each antenna in the array 204 serving as an electric field sensor for its location. The voltage difference between one or more selected pairs of antennas in the array 204 is measured or otherwise determined. The antennas in the array 204 are coupled to a voltage differencer 206. The voltage differencer 206 is any device, circuit, etc., that can collect voltages sensed by a selected pair of antennas and then form a difference (i.e., a voltage difference) between the voltages so-collected. Each such collected voltage difference is provided to a processor 208. The processor 208 is any processing device, circuit, etc., that processes each voltage difference by dividing it by the distance between the antennas of the pair which results in a "voltage per distance" quantity. The resulting set of "voltage per distance" quantities over the known antenna array locations describes the electric field in the region occupied by the array 204, and depending on the application, this information can be further processed by the processor 208, or could be provided to some type of output device 210 for data "presentation" to a user. The output device 210 is preferably capable of producing a viewable image of the electric field data.

The generator 20 is used in the system 200 for producing a known or controllable electric field in some region 212 in which the object 202 can be present. The generator 20 is controllable by the processor 208 (or by a separate processor/controller). In an airport security scenario, the region 212 could be a fixed housing/scanner through which personnel must pass. The region 212 could also be locally created in the case of a hand-held system 200 and/or in the case of a hand-held generator 20. The region 212 could also be a fixed portal or platform with one or more of array 204, differencer 206, processor 208, and output device 210 being portable. Object 202 is representative of anything that could disturb the known/created electric field in region 212. That is, object 202 can be made of any electrically-conductive and non-conductive materials, such as solids, liquids, gases, etc. Referring again to an airport security scenario, a person without any objects of interest would disturb the electric field in region 212 in some pre-determined known fashion. However, if a person were carrying some additional object, the electric field would be disturbed in a way that was outside established norms thereby providing security personnel with an indication that further scrutiny is required.

Figure 2:
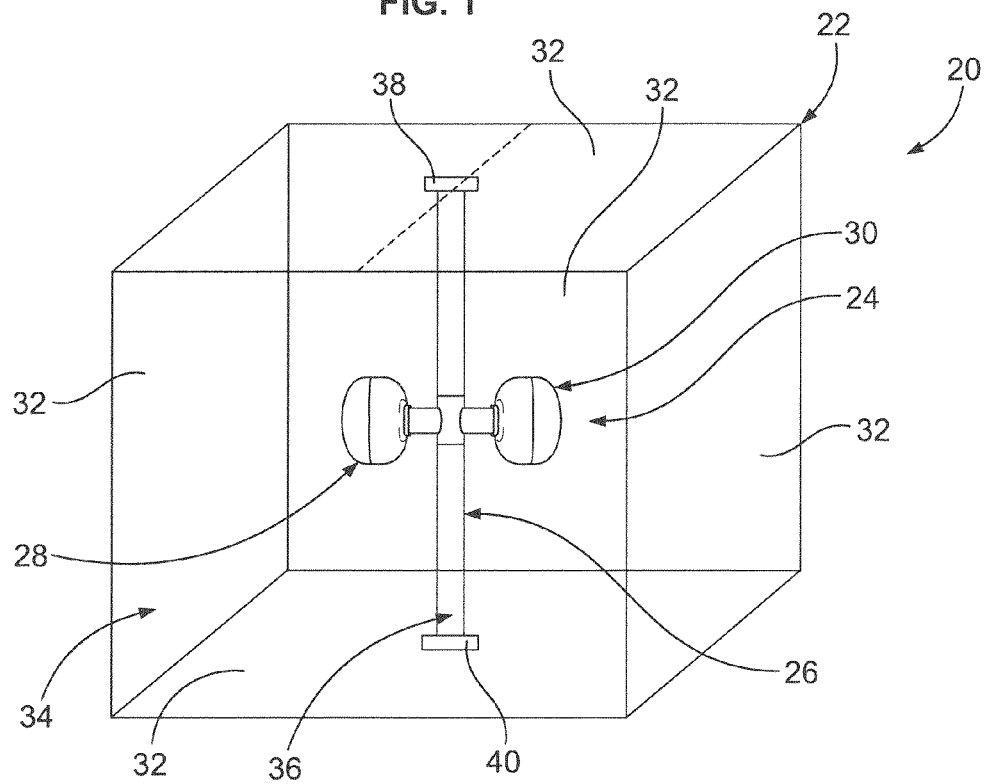
FIG. 2 is a perspective view of the generator.
Figure 3:
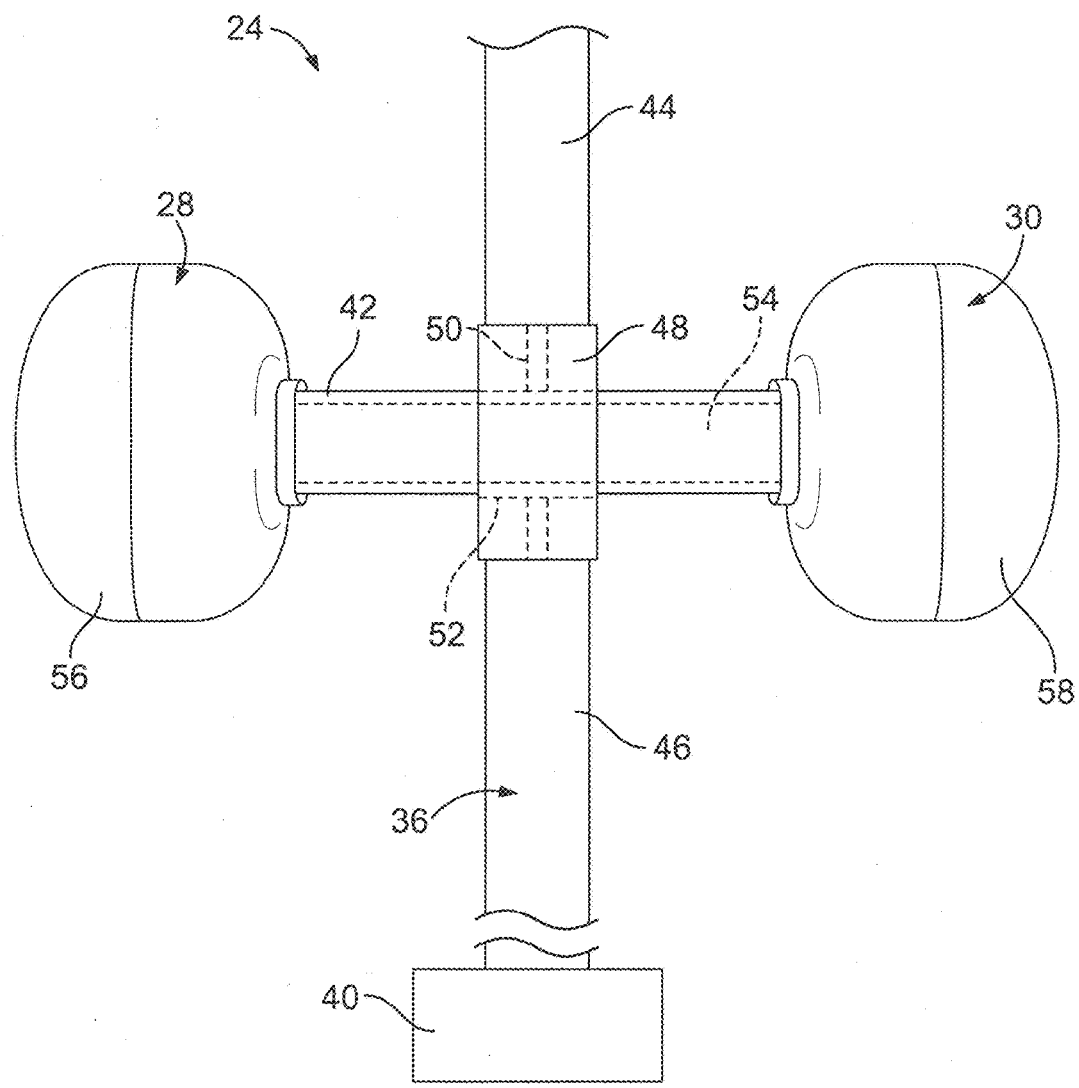
FIG. 3 is perspective view of a portion of the generator.
Figure 5:
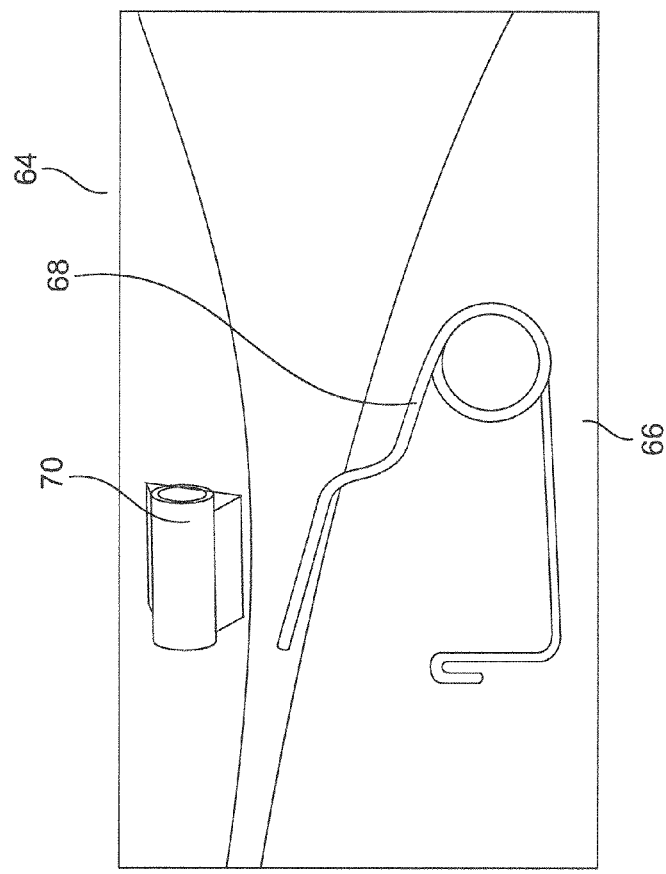
FIG. 5 is a side elevation view of another portion of the generator.
Figure 4:
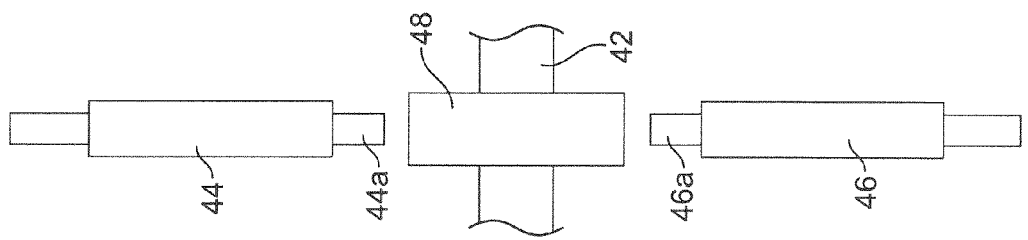
FIG. 4 is a side elevation view of a portion of the generator.

As shown in FIG. 2, the generator 20 includes a casing 22 in which an electrostatic dipole element 24 is mounted to a support structure 26. The dipole element 24 has a negative electrode 28 and a positive electrode 30.

The casing 22 is illustrated as a square prism, but other shapes can be provided. All surfaces 32 of the casing 22 (the casing 22 is shown such that the interior components can be seen), except for one surface 34, are formed of a non-conducting and triboelectrically neutral material. The remaining surface 34 is formed of an electrically insulated conducting material. The non-conducting and triboelectrically neutral surfaces 32 of the casing 22 allows the electric fields from the dipole element 24 to be established without substantial distortion. The electrically insulated conducting surface 34 serves as an electrically floating equipotential surface and this electrically insulated conducting surface 34 establishes a uniform electric field. As a result, a uniform electric field is established external to the casing 22 and adjacent to the electrically insulated conducting surface 34, where the electrically insulated conducting surface 34 serves as an approximation of an infinite large conducting surface. The generator 20 can be used without the electrically insulated conducting surface 34 to produce a more complex static electric field pattern, and other surfaces with different electromagnetic properties and shapes can be used. The use of the electrically insulated conducting surface 34 forms an equipotential surface, and the use of the electrically floating conducting surface and application of the infinite conducting plate approximation produces a uniform, large magnitude, electric field that is human-safe (supporting only micro ampere currents) over a large area and volume suitable for inspections.

The support structure 26 includes a non-conducting and triboelectrically neutral rotation shaft 36, a rotational bearing support 38, a rotation stage drive system 40, and a support sleeve 42 upon which the negative and positive electrodes 28, 30 of the dipole element 24 are mounted. The rotation stage drive system 40 is, for example, a stepper motor. The non-conducting and triboelectrically neutral rotation shaft 36 is mounted to the casing 22 by the rotational bearing support 38 at one end thereof, and by the rotation stage drive system 40 at the other end thereof. The shaft 36 is preferably formed from first and second arms 44, 46 connected together by a central mount 48.

The mount 48 is formed from a non-conducting material, such as polyvinyl chloride (PVC). The mount 48 can be triboelectrically neutral. The mount 48 has a passageway 50 extending from a first end to a second end (this could also be formed as two separate blind bores). A central passageway 52 extends through the mount 48 and is perpendicular to the passageway 50.

The arms 44, 46 are formed from a non-conducting and triboelectrically neutral material, such as wood. One arm 44 engages with the passageway 50 at the first end, and the other arm 46 engages with the passageway 50 at the second end. As shown, each arm 44, 46 has smaller diameter ends 44a, 46a which are press fit into the ends of the passageway 50. Other means for securing the arms 44, 46 to the mount 48 can be used provided the non-conducting and triboelectrically neutral properties are maintained.

The support sleeve 42 upon which the negative and positive electrodes 28, 30 of the dipole element 24 are mounted is formed from a non-conducting material, such as PVC. The support sleeve 42 can be triboelectrically neutral. The support sleeve 42 has a central passageway 54 extending from a first end to a second end. The support sleeve 42 extends through the passageway 52 through the mount 48 and is suitably secure thereto, for example by press-fit, pins, ultrasonic welding.

The non-conducting and triboelectrically neutral shaft 36 and support sleeve 42 allows the electric field which is generated by the dipole element 24 to be undisturbed by its supporting elements, and the rotation provides for operation in the quasi-static regime. The shaft 36 and support sleeve 42 prohibit current flow directly between the electrodes 28, 30 and allow for build-up of and depletion of electrical charges on the electrodes 28, 30.

The rotational bearing support 38 is provided at one end of the shaft 36 and the rotation stage drive system 40 is provided at the other end of the shaft 36. The bearing support 38 and the drive system 40 provide a controlled rotation of the dipole element 24 to operate in the quasi-static regime. Although a non-conducting and triboelectrically neutral material is preferably provided for the bearing support 38 and the drive system 40 to allow the dipole electric field to develop undistorted, a metal bearing support 38 and a metal drive system 40 can be used.

The dipole element 24 generates a variable magnitude electric dipole field by establishing an electrostatic potential difference that can exceed 200,000 volts, or more, between the electrodes 28, 30. The dipole element 24 provides the large magnitude electric fields needed for inspections by the system 200. The dipole element 24 includes a pair of covers 56, 58, a charging system, described herein, and a wireless motor system, described herein.

Each cover 56, 58 serves as the respective electrode 28, 30 and, as shown, is formed of two conductive parts 64, 66 which, when joined together, forms a uniform exterior oblate spheroid shape. The two parts 64, 66 are secured together via a plurality of internal cover latches such that the outer shape of the cover 56, 58 is uninterrupted. Other shapes can be used for the electrodes 28, 30 depending on the final electric field required.

Each cover latch is formed from a spring 68 on one part 66 which seats within a housing 70 on the other part 64. The cover latches are engaged by placing the two parts 64, 66 together and rotating the part 66 relative to part 64. When rotated, the end of the spring 68 engages within the housing 70. The end of the spring 68 is outwardly biased to cause the housing 70 and the spring 68 to maintain contact.

Figure 6:
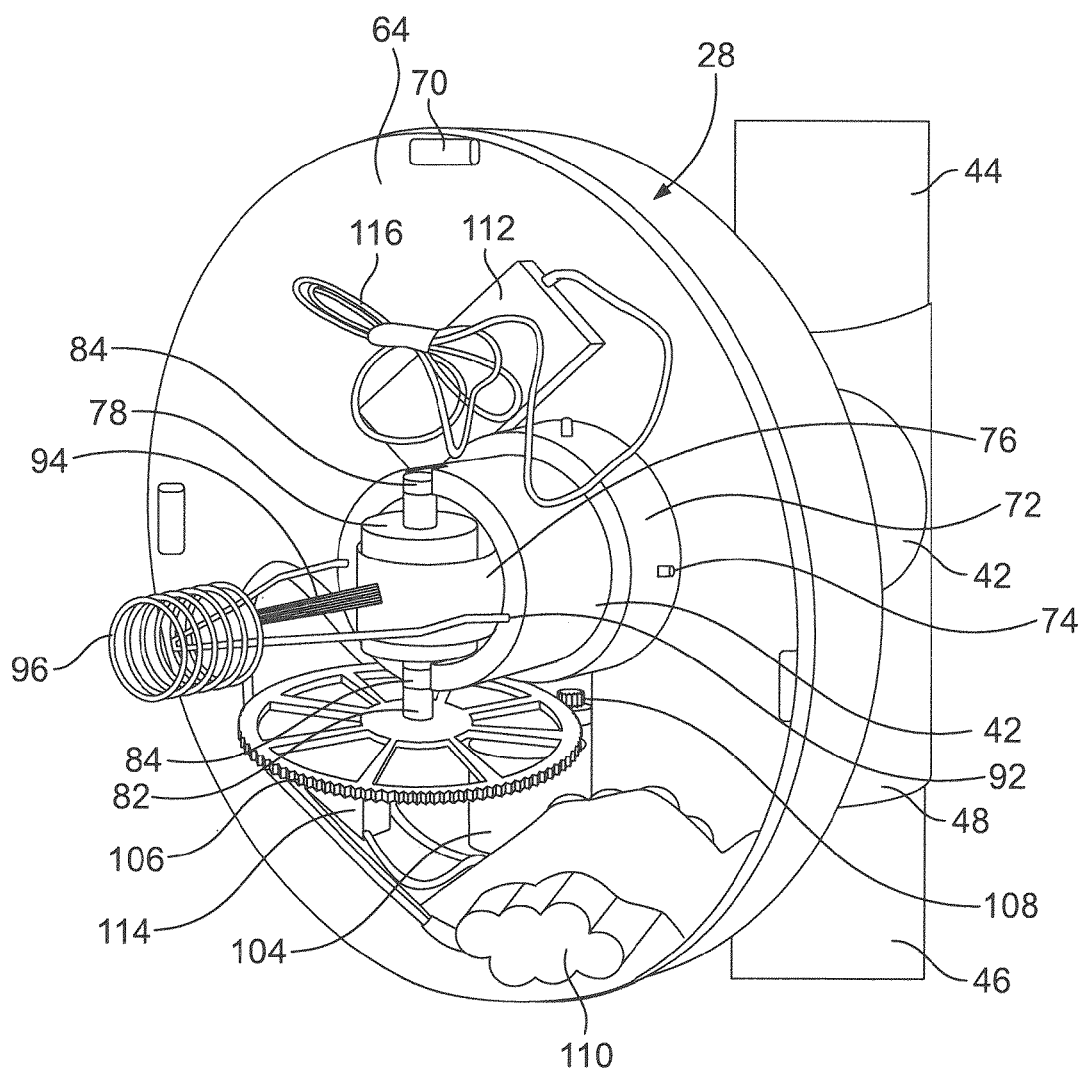
FIG. 6 is a perspective view of the negative electrode of the generator.
Figure 7:
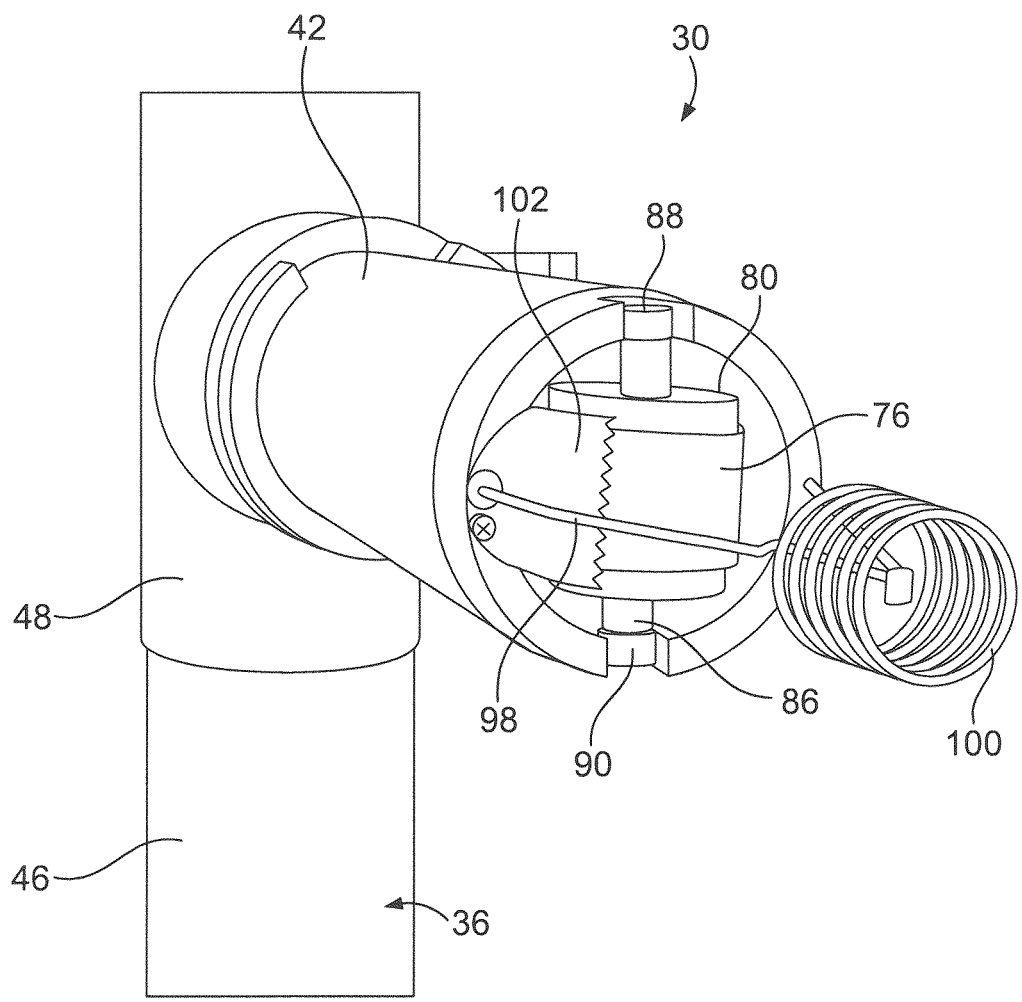
FIG. 7 is a perspective view of the positive electrode of the generator.

A passageway (not shown) is provided through each part 64 through which the respective ends of the support sleeve 42 extends. The support sleeve 42 and the parts 64 are suitably secured to each other, for example by press-fit, pins, ultrasonic welding. As shown in the drawings, this securement is effected in each two-part cover 56, 58 by using a second non-conducting and triboelectrically neutral sleeve 72 which has a diameter larger than the diameter of the passageway through the parts 64. This second sleeve 72 seats around the support 42 sleeve on the interior of the respective part 64 and pins 74 are used to connect the sleeves 42, 72 together. The interior of the negative electrode 28 is shown in FIG. 6 with part 66 removed, and the interior of the positive electrode 30 is shown in FIG. 7 with both parts 64, 66 removed.

The charging system uses an electrostatic approach. An insulative belt 76, preferably formed of rubber, moves over a pair of friction resistant, insulative pulleys 78 which are mounted on the opposite ends of the support sleeve 42 inside the respective covers 56, 58. The pulley, for example pulley 78, in one of the electrodes 28, 30 is preferably made of or coated with synthetic resinous fluorine-containing polymers commonly sold under the trade name TEFLON®; the pulley, for example pulley 80, in the other of the electrodes 28, 30 is preferably made of nylon. For ease of description, the pulley 78 is disclosed as being in the negative electrode 28, while the pulley 80 is disclosed as being in the positive electrode 30. Pulley 78 is supported in the negative electrode 28 at the end of the support sleeve 42 via an axle 82 and two bearings 82, 84 (the support sleeve 42 is shown partially cut away to show the bearings 82, 84). Pulley 80 is supported in the positive electrode 30 at the opposite end of the support sleeve 42 via an axle 86 and two bearings 88, 90 (the support sleeve 42 is shown partially cut away to show the bearings 88, 90). The belt 76 surrounds both pulleys 78, 80 and extends through the passageway 54 of the support sleeve 42. The pulleys 78, 80 preferably have a curved profile, either convex or concave, to prevent the belt 76 from easily slipping off of the pulleys 78, 80. It is to be understood that other materials can be used for the electrostatic approach than those specifically disclosed herein.

In the negative electrode 28, a support bracket 92 extends from the support sleeve 42 and supports a metal brush 94 and a contact 96, preferably formed of a spring, at its opposite end. The free ends of the metal brush 94 are proximate to, but are not in contact with, the rubber belt 76 (contact with the belt 76 will cause the belt 76 to degrade) such that a small air gap is provided between the brush 94 and the belt 76. The free end of the contact 96 is in contact with the part 66 of the negative electrode 28. In the positive electrode 30, a support bracket 98 extends from the support sleeve 42 and supports a contact 100, formed of a spring, at its opposite end. The contact 100 is in contact with the part 66 of the positive electrode 30. A metal brush 102 extends from the support sleeve 42 and the free end of the metal brush 102 is proximate to, but is not in contact with, the rubber belt 76 (again, contact with the belt 76 will cause the belt 76 to degrade) such that a small air gap is provided between the brush 102 and the belt 76. It is to be understood that the brushes, support brackets and contacts can be identically formed in each electrode 28, 30. One or both of the covers 56, 58 can be removed to enable the rubber belt 76 to be changed when needed.

When the parts 64, 66 of each cover 56, 58 are rotated into place to engage the cover latches, the spring contacts 96, 100 press against the part 66 to bias the part 66 outwardly. This outward biasing further engages the springs 68 in the housings 70 to prevent the parts 64, 66 from disengaging from each other. A counterweight (not shown) of any suitable material is mounted on cover 58 on the inside surface thereof. The counterweight prevents the dipole element 24 from wobbling during rotation. Although cover 56 is described as having two separable parts 64, 66, since cover 56 does not contain a battery 110 (discussed herein) that may need to be changed by removing part 66, the parts 64, 66 of cover 58 can be permanently bonded together, can slide over support 54 and be held onto support 54 by a clip.

The axle 82, and thus the pulleys 78, 80, are rotated via the motor system, described herein. Using the triboelectric property of moving contact of dissimilar materials, free electrons from the cover 58 (parts 64, 66) forming the positive electrode 30 travel through the spring contact 100, along the support bracket 98, through the metal brush 102, across the air gap between the metal brush 102 and the belt 76, and onto the belt 76. The electrons travel along the belt 76 as it rotates, and then travel along the metal brush 96, across the air gap between the belt 76 and the metal brush 96, to the spring contact 92 and are then passed to the cover 56 (parts 64, 66) forming the negative electrode 28. The charges build up on the negative electrode 28, but are simultaneously depleted from the positive electrode 30. If the pulleys 78, 80 are reversed, the negative electrode 28 becomes the positive electrode 30, and the positive electrode 30 becomes the negative electrode 28; the charges then travel in the reverse order. It is to be understood that what cover 56, 58 is the negative electrode and which is the positive electrode is dependent upon the materials selected for the belt 76 and the pulleys 78, 80.

The wireless motor system is shown housed in the negative electrode 28 (but it could be in the positive electrode 30 to rotate axle 86) and includes a motor 104, a drive gear 106 which is rotated by the motor 104, a reduction gear 108 which is rotated by the drive gear 106 and rotates the axle 82, a rechargeable battery 110 for driving the motor 104, a wireless receiver 112, a wireless transmitter (not shown), a wireless motor controller 114 and an antenna 116. The ratio of gears 106, 108 and motor speeds allows for establishing the magnitude of the dipole electric field. The wireless motor system is used to control the magnitude of the dipole electric field while the dipole element 24 is rotating, and does so without an electrically conductive path from the outside of the casing 22 to the dipole element 24. A voltage control mechanism (such as an isolated wire placed midway between the electrodes 28, 30) can also be used to either limit or control the potential difference between electrodes 28, 30. Without the wireless motor system, the electric potential between the electrodes 28, 30 will be at a fixed value at its maximum. Variable maximum electric magnitude strength levels are needed to provide adequate inspection coverage of a variety of materials. Since the motor system and the charging system are wholly contained within the covers 56, 58 and the support sleeve 42, there is no leakage path for currents. If the motor control was externally wired, the presence of the control wires provides a path for large leakage currents which would result in greatly diminish maximum electric field magnitudes.

The construction configuration and materials of the generator 20 limit leakage current from the dipole element 24 to shaft controls the shape of the electric field emanating from the dipole element 24. If leakage currents are not minimized, then the dipole element 24 will not produce an electric field with the adequate maximum magnitude needed for inspections. If the electric field shape is distorted by conducting or dielectric materials, then the electric field developed can be outside the quasi-static regime or inadequate for inspections. As a result of the structure, the dipole element 24 is not grounded, while being high voltage.

Figure 8:
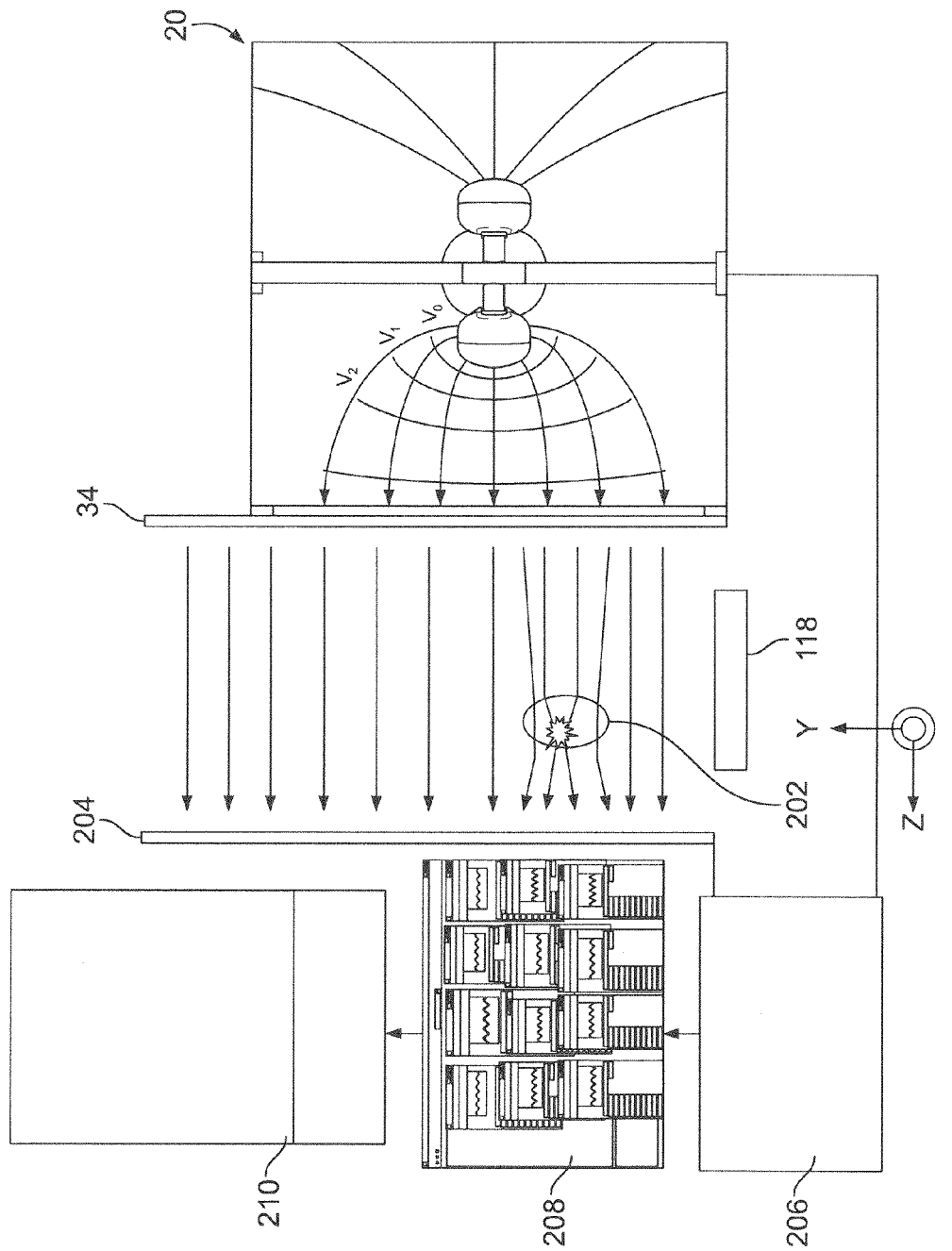
FIG. 8 is a schematic view of the generator used in an inspection configuration with the system of FIG. 1.
Figure 9:
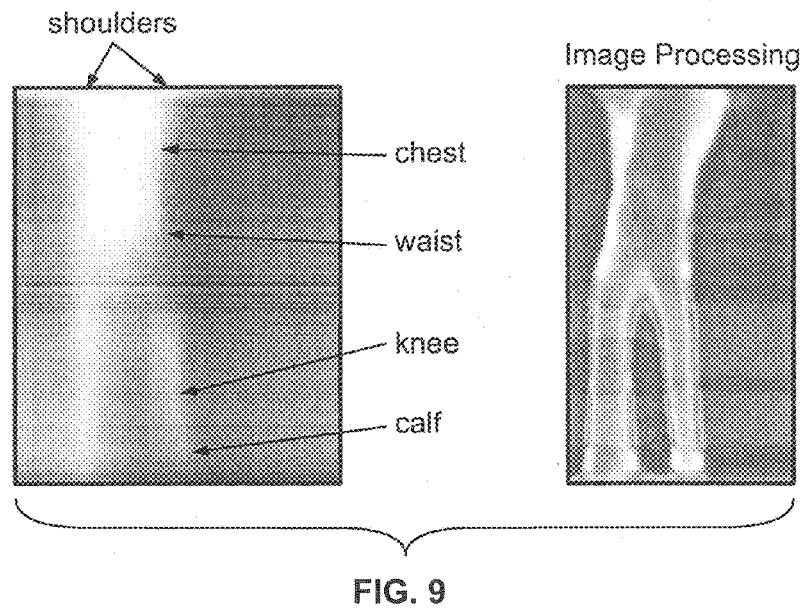
FIG. 9 are electric field imaging images.
Figure 10:
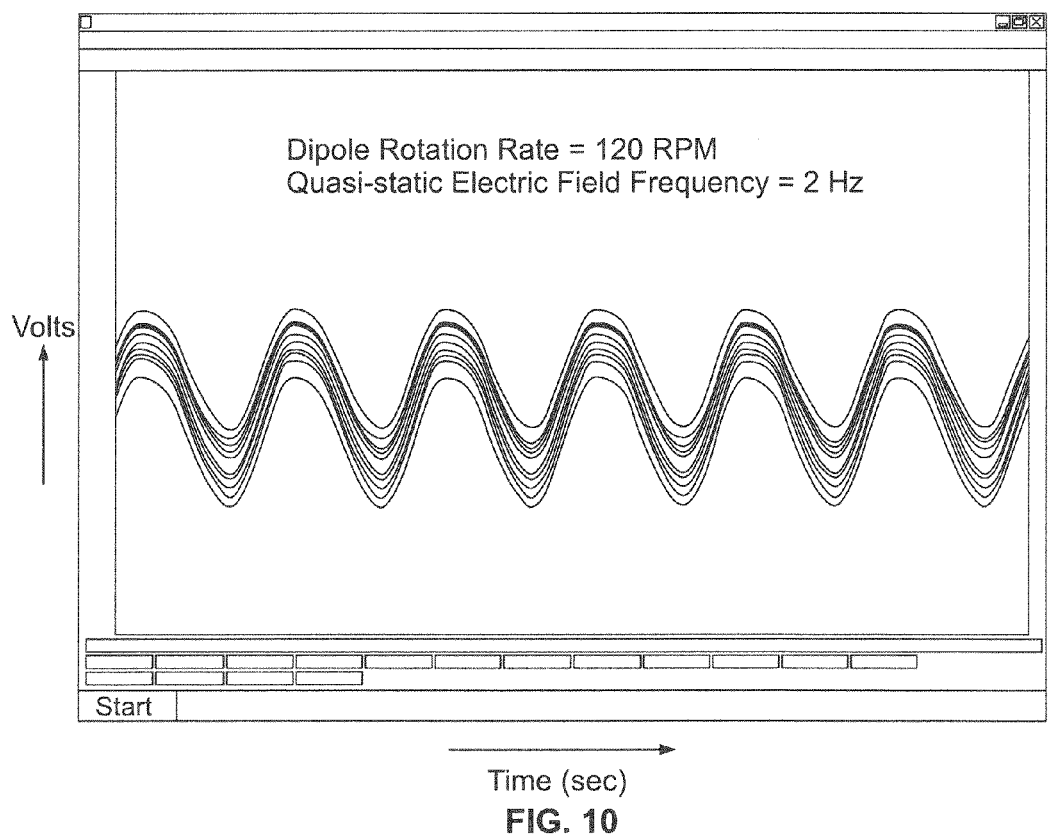
FIG. 10 is a graph showing responses from a three foot long linear antenna array placed four feet from the generator.
Figure 11:
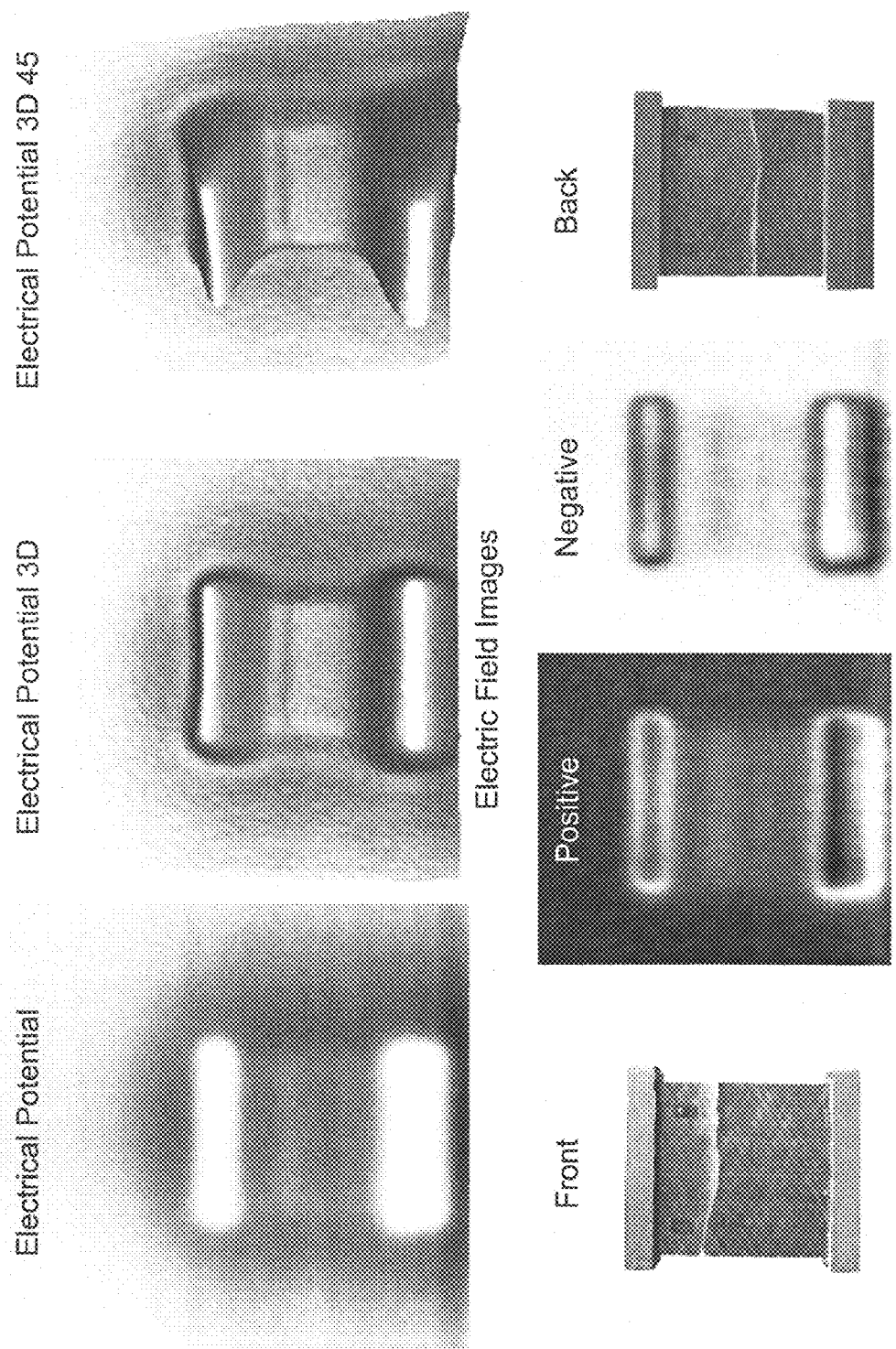
FIG. 11 are front and back views of a product being imaged, and the electric field imaging images produced using the generator and system.

FIG. 8 shows the generator 20 used in an inspection configuration with the system 200. In this configuration, the object 202 being inspected is moved, via a conveyor 118, between the generator 20 and the system 200. During movement of the object 202, the dipole element 24 may be rotating at any desired rotation speed from zero rotation per minute (RPM) up to the maximum RPM allowable in the quasi-static regime. Data acquisition of the system response can be performed when a preselected voltage, for example, Vsurface, occurs on the electrically insulated conducting surface 34, or throughout the cycle of the rotation of the dipole element 24. Data acquired at a preselected voltage corresponds to a constant interrogation electric field strength, while data acquired during the rotation of the dipole element 24 corresponds to varying interrogating electric field magnitudes. During testing, it has been found that responses from a three foot long linear antenna array 204 placed four feet from the generator 20 results in a generally uniform electric field generated by the generator 20 as shown in FIG. 10. The acquired data can be processed, as described in United States Patent Application Number 2012-0199755 A1, to generate images of the electric field from the object 202 being inspected. EFI reconstructions are produced using the vector spatial components of the acquired electric field. FIG. 8 shows an example of an electric field image from an object using only the x-component of the acquired electric field. The acquired data can be used to generate magnitude and vector electric field images using x, y, and z spatial electric field components as well as images of electrical potential. As disclosed in United States Patent Application Number 2012-0199755 A1, many other scanning and array configurations are possible. FIG. 9 shows an electrical potential image and a processed image of a human. FIG. 11 shows the back and front views of a product being imaged (the front is shown in the bottom left corner and the back is shown in the bottom right corner), and the electric field imaging images produced using the generator 20 and system 200 of the present invention.

In normal operation, various equipotential surfaces are included to provide a wide variety of "illumination" configurations to include uniform, radially symmetric, cylindrically symmetric and well as an unlimited number of complex non-symmetric electric field profiles. In normal operation, there can be a large equipotential surface covering the front of the dipole element 24. The generator 20 can be larger for inspection of aerospace components, containers, baggage, and personnel. A small system of generator 20 equal to the size of a deck of cards can also be made.

While a preferred embodiment of the present invention is shown and described, it is envisioned that those skilled in the art may devise various modifications of the present invention without departing from the spirit and scope of the appended claims.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

All ranges disclosed herein are inclusive of the endpoints, and the endpoints are independently combinable with each other. Each range disclosed herein constitutes a disclosure of any point or sub-range lying within the disclosed range.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." As used herein, the term "and/or" includes any and all combinations of one or more of the associated listed items. As also used herein, the term "combinations thereof" includes combinations having at least one of the associated listed items, wherein the combination can further include additional, like non-listed items. Further, the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

Reference throughout the specification to "another embodiment", "an embodiment", "some embodiments", and so forth, means that a particular element (e.g., feature, structure, and/or characteristic) described in connection with the embodiment is included in at least one embodiment described herein, and can or cannot be present in other embodiments. In addition, it is to be understood that the described elements can be combined in any suitable manner in the various embodiments and are not limited to the specific combination in which they are discussed.

This written description uses examples to disclose the invention, including the best mode, and also to enable any person skilled in the art to make and use the invention. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A generator for producing an electric field comprising:
   a casing;
   a non-conducting and triboelectrically neutral rotation shaft having a first end and a second end;
   a rotational bearing support provided at the first end of the shaft, the rotational bearing support is mounted to the casing;
   a drive system provided at the second end of the shaft, the drive system is mounted to the casing and is capable of rotating the shaft;
   an electrostatic dipole element having a negative electrode and a positive electrode; and
   a non-conducting support sleeve for mounting the negative electrode of the dipole element to the shaft and for mounting the positive electrode of the dipole element to the shaft,
   wherein the shaft and the support sleeve are configured to prohibit current flow directly between the negative electrode and the positive electrode, and
   wherein the generator works in a quasi-static range, the quasi-static range being associated with repeated generation of static fields at a rate less than a predefined quasi-static frequency threshold such that an instantaneous measurement of the electric field represents a static field.

2. The generator of claim 1, wherein the casing has a surface which is formed of an electrically insulated conducting material and all remaining surfaces are formed of a non-conducting and triboelectrically neutral material.

3. The generator of claim 1, wherein the rotational bearing support and the drive system are formed of a non-conducting and triboelectrically neutral material.

4. The generator of claim 1 , wherein the rotational bearing support and the drive system are formed of metal.

5. The generator of claim 1, further including a charging system which uses an electrostatic approach, the charging system is wholly contained within the dipole element and the support sleeve.

6. The generator of claim 5, further including a wireless motor system wholly contained within the dipole element.

7. The generator of claim 5, wherein the charging system includes a driven belt, a first brush housed in one of the electrodes and proximate to the belt, and a second brush housed in the other of the electrodes and proximate to the belt, the belt being formed of a first material and the brushes being formed of a second material which is different than the first material.

8. The generator of claim 7, wherein the charging system further includes a first and second pulleys around which the belt rotates.

9. The generator of claim 8, wherein the first pulley is formed of a material which is different than the first material, and the second pulley is formed of a material which is different than the first material, the belt being rotated via the pulleys.

10. The generator of claim 5, wherein the charging system further includes a first contact connected to the first brush and to the negative electrode, and a second contact connected to the second brush and to the positive electrode.

11. The generator of claim 10, wherein the first and second contacts are springs.

12. The generator of claim 1, wherein each of the negative electrode and the positive electrode have an oblate spheroid shape.

13. A generator for producing an electric field comprising:
a casing formed from a surface which electrically insulated conducting material and all remaining surfaces are formed of a non-conducting and triboelectrically neutral material;
a non-conducting and triboelectrically neutral rotation shaft having a first end and a second end;
a rotational bearing support provided at the first end of the shaft, the rotational bearing support mounted to the casing;
a drive system provided at the second end of the shaft, the drive system mounted to the casing and capable of rotating the shaft;
an ungrounded electrostatic dipole element which works in a quasi-static range, the dipole element having a negative electrode having a conductive cover, a positive electrode having a conductive cover, a charging system, and a wireless motor system, the quasi-static range being associated with repeated generation of static fields at a rate less than a predefined quasi-static frequency threshold such that an instantaneous measurement of the electric field represents a static field; and
a non-conducting support sleeve for mounting the dipole element to the shaft;
wherein the charging system and the wireless motor system are wholly contained within the dipole element and the support sleeve, the charging system using an electrostatic approach to charge one of the electrodes, and
wherein the shaft and the support sleeve are configured to prohibit current flow directly between the negative electrode and the positive electrode, and
wherein the generator works in a quasi-static range, the quasi-static range being associated with repeated generation of static fields at a rate less than predefined quasi-static frequency threshold such that an instantaneous measurement of the electric field represents a static field.

14. The generator of claim 13, wherein the rotational bearing support and the drive system are formed of a non-conducting and triboelectrically neutral material.

15. The generator of claim 13, wherein the rotational bearing support and the drive system are formed of metal.

16. The generator of claim 13, wherein each of the negative electrode and the positive electrode have an oblate spheroid shape.

17. The generator of claim 13, wherein the charging system includes
a driven belt formed of a first material,
a first pulley formed of a material which is different than the first material,
a second pulley formed of a material which is different than the first material, the belt being rotated via said pulleys,
a first brush housed in one of the electrodes and proximate to the belt, and
a second brush housed in the other of the electrodes and proximate to the belt,
a first contact connected to the first brush and to the negative electrode, and
a second contact connected to the second brush and to the positive electrode.

18. The generator of claim 17, wherein the first and second contacts are springs.

19. The generator of claim 13, wherein the support sleeve is triboelectrically neutral.

20. A generator for producing an electric field comprising:
a non-conducting and triboelectrically neutral rotation shaft having a first end and a second end;
a rotational bearing support provided at the first end of the shaft;
an electrostatic dipole element having a negative electrode and a positive electrode;
a non-conducting support sleeve for mounting the negative electrode of the dipole element to the shaft and for mounting the positive electrode of the dipole element to the shaft;
wherein the shaft and the support sleeve are configured to prohibit current flow directly between the negative electrode and the positive electrode; and
wherein the generator is configured to operate in a quasi-static range, the operation in the quasi-static range including repeated generation of static fields at a rate less than a predefined quasi-static frequency threshold such that an instantaneous measurement of the electric field represents a static field.

* * * * *